United States Patent
Hosokawa et al.

(10) Patent No.: US 6,756,241 B2
(45) Date of Patent: Jun. 29, 2004

(54) METHOD OF MANUFACTURING SEMICONDUCTOR DEVICE AND SYSTEM FOR MANUFACTURING THE SAME

(75) Inventors: Tomohiro Hosokawa, Tokyo (JP); Satoshi Shimizu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 105 days.

(21) Appl. No.: 10/026,551

(22) Filed: Dec. 27, 2001

(65) Prior Publication Data

US 2002/0081754 A1 Jun. 27, 2002

(30) Foreign Application Priority Data

Dec. 27, 2000 (JP) ........................................ 2000-397501

(51) Int. Cl.⁷ ............................................. H01L 21/00
(52) U.S. Cl. ........................................... 438/7; 356/388
(58) Field of Search ............................... 438/7; 356/388

(56) References Cited

U.S. PATENT DOCUMENTS 5,210,041 A * 5/1993 Kobayashi et al. ............ 438/7
6,424,417 B1 * 7/2002 Cohen et al. ................ 356/388

FOREIGN PATENT DOCUMENTS

| JP | 5-259015 | 10/1993 |
| JP | 10-163080 | 6/1998 |
| JP | 11-16805 | 1/1999 |
| JP | 11-219874 | 8/1999 |
| JP | P2000-133568 A | 5/2000 |

* cited by examiner

Primary Examiner—John F. Niebling
Assistant Examiner—Andre' Stevenson
(74) Attorney, Agent, or Firm—McDermott, Will & Emery (57) ABSTRACT

A manufacturing method of a semiconductor device to perform processing, including pre-processing and post-processing, on a semiconductor substrate, a characteristic of the processed semiconductor substrate is inspected, whether the semiconductor substrate complies with a predetermined standard is judged, and a semiconductor substrate not complying with the standard is re-processed so that the semiconductor substrate complies with the standard.

7 Claims, 10 Drawing Sheets

METHOD OF MANUFACTURING SEMICONDUCTOR DEVICE AND SYSTEM FOR MANUFACTURING THE SAME

BACKGROUND OF THE INVENTION

The present invention relates to a method of and a system for manufacturing a semiconductor device, and more particularly, to a method of and a system for manufacturing a semiconductor device in which inspection is followed by re-processing.

Figure 10:
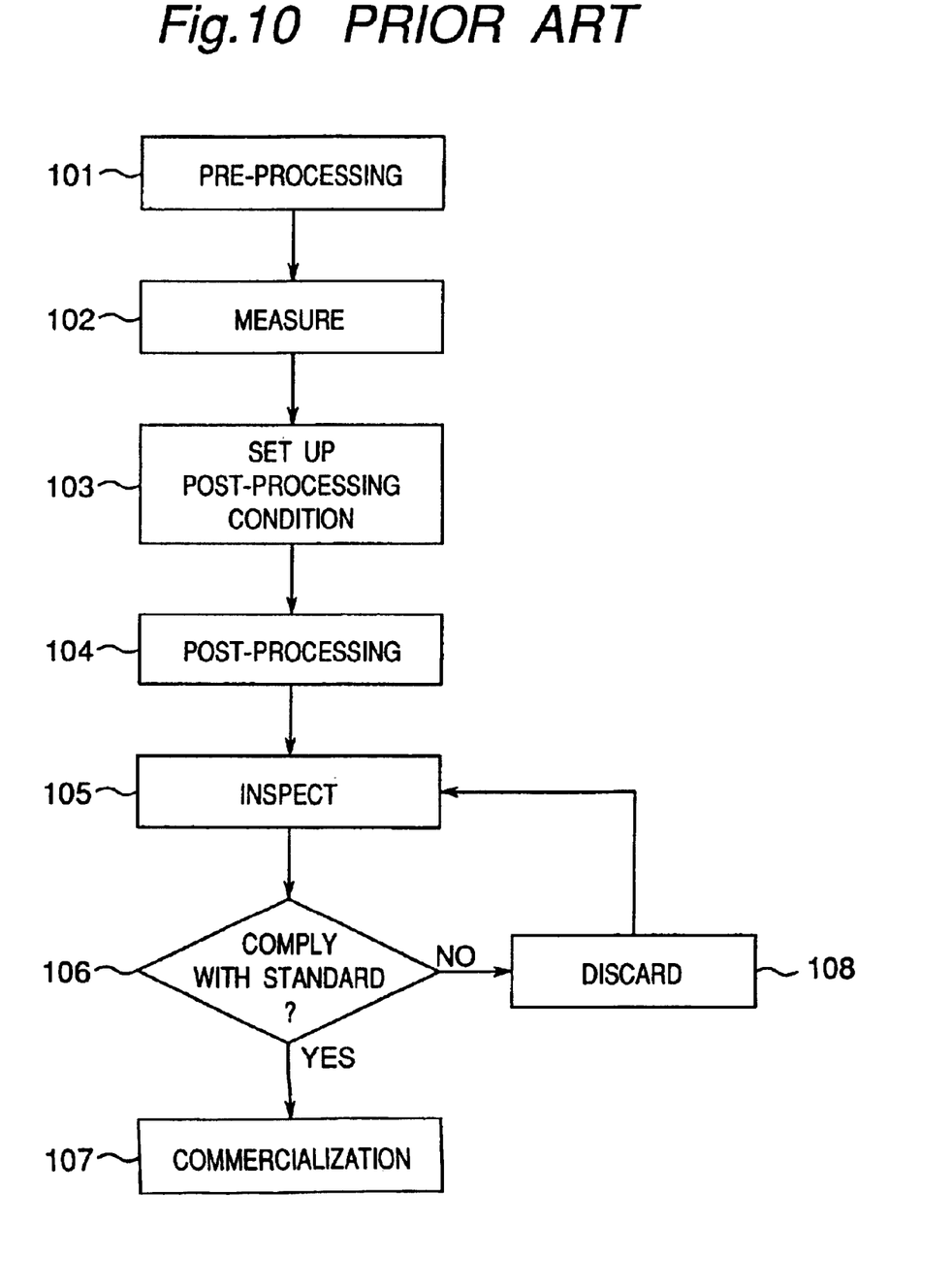
FIG. 10 is a manufacturing step diagram of conventional manufacturing.

FIG. 10 is a manufacturing step diagram for a conventional semiconductor device. These manufacturing steps are used to form side walls 45 as those shown in FIG. 4, for example. Now, steps of forming the side walls 45 will be described with reference to FIG. 4.

First, at a step 101, pre-processing for depositing an insulation film 43 is executed so as to cover a semiconductor substrate 41 and a gate electrode 42 formed on the semiconductor substrate 41.

Next, at a step 102, a film thickness of the insulation film 43 is measured. At a step 103, a condition for a step 104 is set up based on a result of the measurement at the step 102.

Next, at the step 104, post-processing is executed, in which the insulation film 43 is etched back in accordance with an etching condition determined at the step 103 and the side walls 45 are consequently formed on the both sides of the gate electrode 42.

Next, at a step 105, widths of the side walls 45 are measured and whether the widths comply with a predetermined standard is inspected.

Next, at a step 106, whether a result of the inspection at the step 105 complies with a predetermined standard is judged. If compliance with the standard is found, the sequence proceeds to a step 107 for commercialization. On the other hand, if there is not compliance with the standard, the sequence proceeds to a step 108 for discarding.

However, discarding semiconductor substrates despite slight incompliance of the result of the inspection at the step 105 prevents an improvement to a production yield and makes it difficult to reduce production costs.

SUMMARY OF THE INVENTION

Noting this, the present invention aims at providing a method of and a system for manufacturing a semiconductor device which re-process a semiconductor substrate failing to comply with a predetermined standard to comply with the standard, and thereby improve a production yield.

The present invention is directed to a manufacturing method of a semiconductor device in which a semiconductor substrate is subjected to processing includes pre-processing and post-processing, comprising: a pre-processing step to process a semiconductor substrate; a measurement step to measure a characteristic of the semiconductor substrate processed at the pre-processing step; a setup step to set a processing condition for post-processing based on a result of the measurement at the measurement step; a post-processing step to process the semiconductor substrate using the processing condition; and an inspection step to inspect a characteristic of the semiconductor substrate processed at the post-processing step and to judge whether compliance with a predetermined standard is found or not, and characterized in further comprising re-processing step to re-process the semiconductor substrate judged not complying with the standard at the inspection step such that the semiconductor substrate complies with the standard.

Using this manufacturing method, a semiconductor substrate judged not complying with a predetermined standard during inspection after the processing step is re-processed so as to comply with the standard. This makes it possible to improve a production yield of semiconductor devices. Further, this makes it possible to reduce production costs.

A processing condition for the re-processing step is determined based on a result of the inspection at the inspection step.

The re-processing step may be one step selected from a group including the pre-processing step and the post-processing step.

This is because executing either the pre-processing step or the post-processing step sometimes allows a characteristic of a semiconductor substrate to comply with a predetermined standard.

The re-processing step may include the pre-processing step, the measurement step, the setup step and the post-processing step.

This is because executing these steps sometimes allows a characteristic of a semiconductor substrate to comply with a predetermined standard.

It is preferable that the pre-processing step is a step at which an insulation film is deposited on the semiconductor substrate, and the post-processing step is a step at which the insulation film is etched using an etching condition determined from a measurement result regarding a film thickness of the insulation film.

This is because executing these steps makes it possible to form a side wall, an inter-layer insulation film or the like.

It is preferable that the pre-processing step is a step at which a field oxide film is formed on the semiconductor substrate, and the post-processing step is a step at which the field oxide film is etched using an etching condition determined based on a measurement result regarding at least one dimension selected between a film thickness of the field oxide film and a width of an active layer region sandwiched by the field oxide film, from a table showing a relationship between the width of the active layer region and an etching quantity of the field oxide film such that the width of the active layer region has a predetermined dimension.

The measurement step is preferably a step to measure one dimension selected between a film thickness and a width of a predetermined portion of the semiconductor substrate.

The present invention is also directed to a manufacturing system for semiconductor device including a pre-processing apparatus and a post-processing apparatus, comprising: a pre-processing apparatus to perform pre-processing on a semiconductor substrate; a measurement apparatus to measure a characteristic of the semiconductor substrate processed by the pre-processing; a setup apparatus to set a processing condition for post-processing based on a result of the measurement performed by the measurement apparatus; a post-processing apparatus to perform post-processing on the semiconductor substrate using the processing condition; an inspection apparatus to inspect a characteristic of the semiconductor substrate processed by the post-processing; and an evaluation apparatus to judge whether a result of the inspection by the inspection apparatus complies with a predetermined standard or not, and further characterized in that said pre-processing apparatus and/or the post-processing apparatus re-process(es) the semiconductor substrate judged not complying with the standard by the evaluation apparatus such that the semiconductor substrate complies with the standard.

The present invention may also include a re-processing condition setup apparatus which sets a re-processing condition for said pre-processing apparatus and/or the post-processing apparatus based on the result of the inspection by the inspection apparatus.

It is preferable that said pre-processing apparatus is a deposition apparatus and the post-processing apparatus is an etching apparatus.

It is preferable that the measurement apparatus is an apparatus which measures one dimension selected between a film thickness and a width of a predetermined portion of the semiconductor substrate.

As clearly described above, the manufacturing method according to the present invention requires to re-process a semiconductor substrate judged not complying with a predetermined standard during inspection after processing, and therefore, makes it possible to ensure compliance with the standard.

This allows improving a production yield of semiconductor devices, and hence, reduces production costs.

DETAILED DESCRIPTION OF THE PREFERRED EMBODIMENTS

Figure 1:
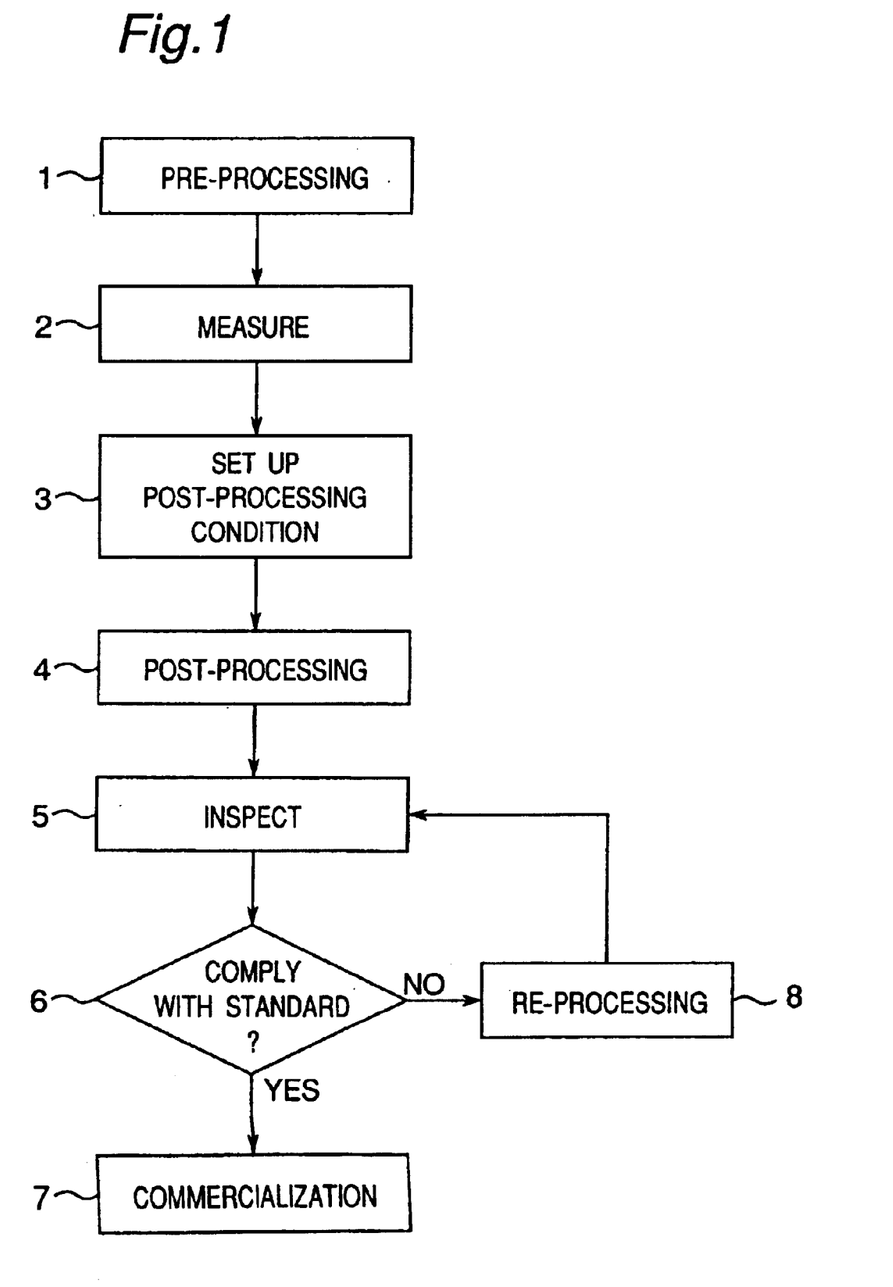
FIG. 1 is a manufacturing step diagram according to the present invention.

FIG. 1 is a manufacturing step diagram for a semiconductor device according to a preferred embodiment of the present invention. From a pre-processing step generally denoted at 1 to a commercialization step generally denoted at 7 are similar to the conventional manufacturing steps 101 to 107 shown in FIG. 10.

The steps according to the preferred embodiment are different from the conventional manufacturing steps in that when it is judged at a step 6 that an inspection result obtained at a step 5 does not comply with a standard, re-processing is executed at a step 8.

Figure 2:
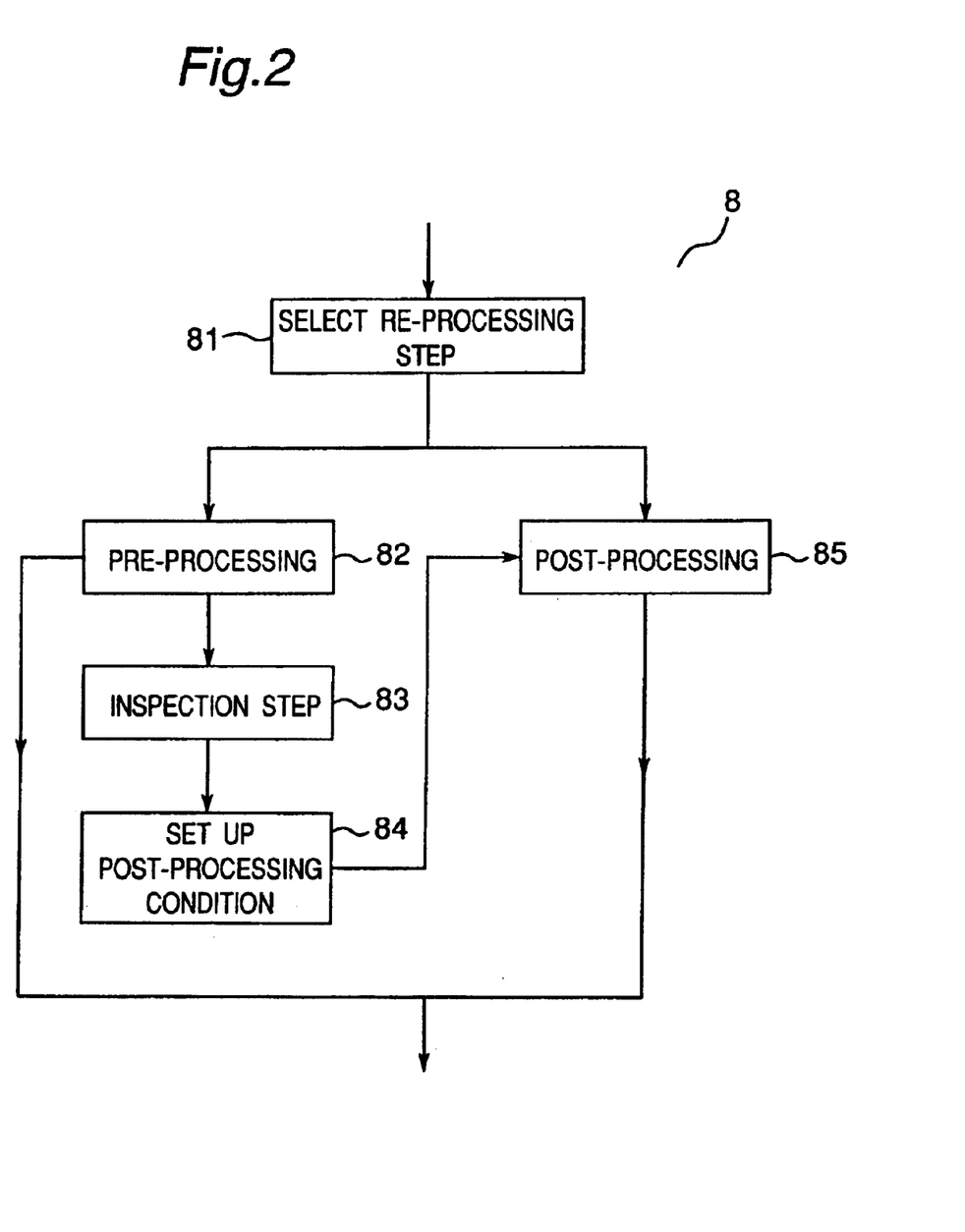
FIG. 2 is a re-processing step diagram according to the present invention.

FIG. 2 shows detailed contents of the re-processing step generally denoted at 8.

When it is judged at the step 6 that there is incompliance with the standard, at the step 8, first, re-processing at a step 81 is selected. The re-processing is selected either as a pre-processing step 82, a post-processing step 85, or the pre-processing step 82 and the post-processing step 85. The pre-processing step 82 is a step with a change to a processing condition for the pre-processing denoted at 1. Moreover the step 85 is a step with a change to a processing condition for the post-processing denoted at 4.

After the re-processing step 8, the inspection step of step 5 is performed once again to thereby judge at the step 6 whether compliance with the standard is found.

When compliance with the standard is found at the step 6 by the re-processing step 8, the sequence proceeds to the step 7 of commercialization.

When compliance with the standard is not found even after the re-processing step 8, the re-processing step 8 may be performed once again or discarding may be performed.

In this manner, according to the preferred embodiment, the pre-processing step 82 and/or the post-processing step 85 are/is executed once again at the re-processing step 8 when a semiconductor substrate already subjected to the pre-processing step 1 and the post-processing step 4 fails to comply with a predetermined standard, and therefore, it is possible to ensure compliance with the predetermined standard. As a result of this, it is possible to improve a production yield of semiconductor devices and reduce production costs, etc.

EXAMPLE 1

Figure 3:
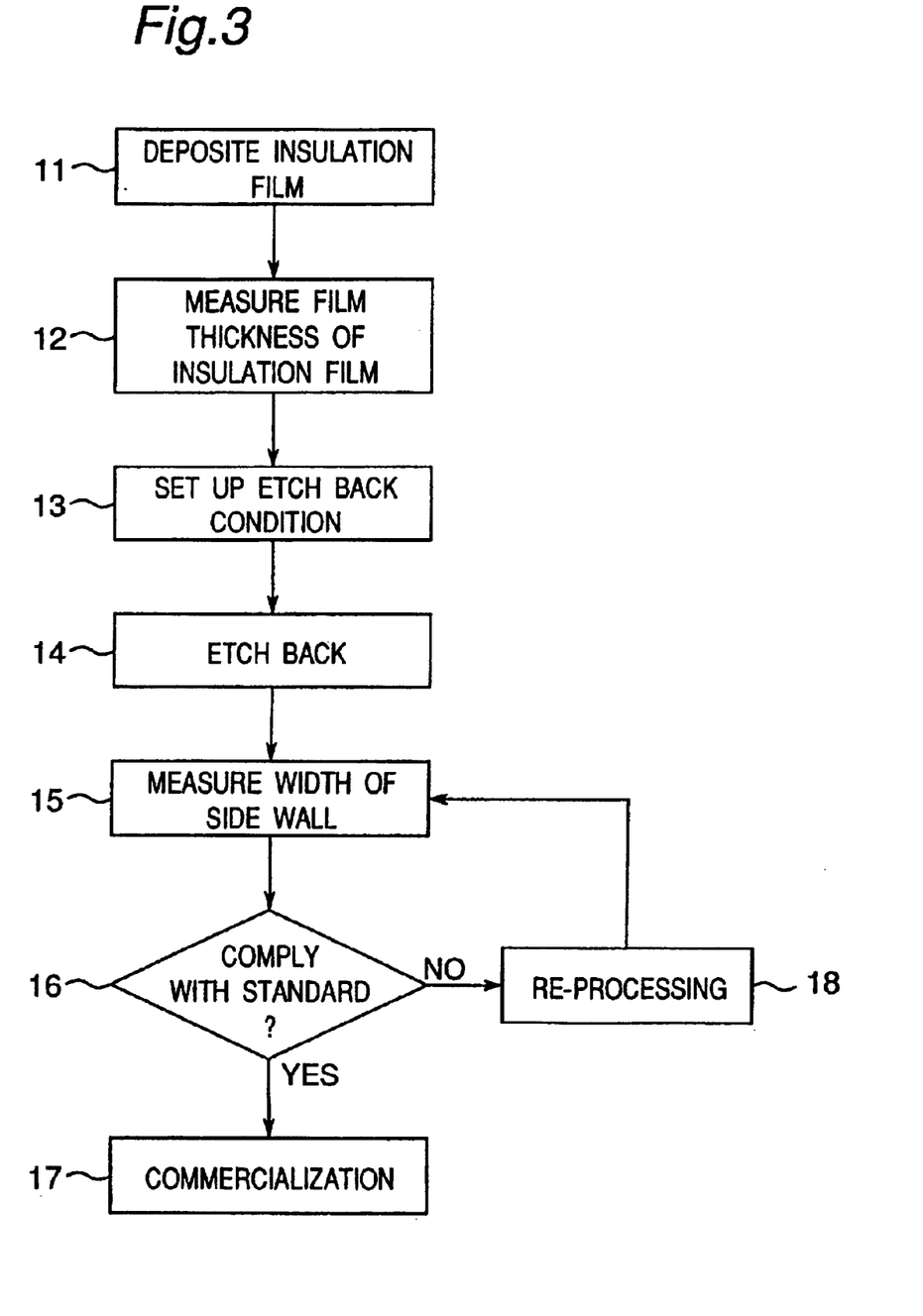
FIG. 3 is a manufacturing step diagram according to the example 1 of the present invention.

FIG. 3 is a manufacturing step diagram for a side wall, using the present invention. Among these manufacturing steps, first, an insulation film is deposited on a semiconductor substrate, as pre-processing at a step 11. Used at the step 11 is a deposition apparatus such as a CVD machine, for instance.

Figure 4A:
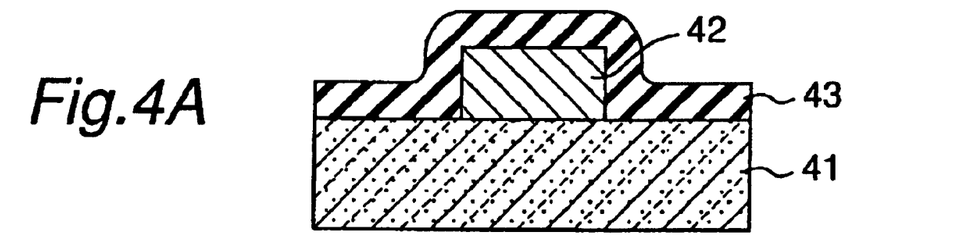
FIGS. 4A and 4B are a cross sectional view showing manufacturing steps according to the example 1 of the present invention.

FIG. 4A is a cross sectional view of a semiconductor substrate 41 as it is at the step 11. A gate electrode 42 is formed on the semiconductor substrate 41. An insulation film 43 is deposited so as to cover a surface of the semiconductor substrate 41 and the gate electrode 42. As the insulation film 43, a silicon oxide film, a silicon nitride film, etc., may be used.

Next, at a step 12, a film thickness of the insulation film 43 is measured.

Next, at a step 13, using a result of the measurement at the step 12, an etching condition to etch back the insulation film 43 is set up. For setup of the etching condition, materials, a film thickness and the like of the insulation film and corresponding appropriate etching conditions are stored in a database in advance, and an etching condition proper to the film thickness measured at the step 12 is selected from the database.

Next, at a step 14, using the etch back condition set up at the step 13, the insulation film 43 is etched back. For the etch back, an etching apparatus such as a sputtering machine is used, for example.

Figure 4B:
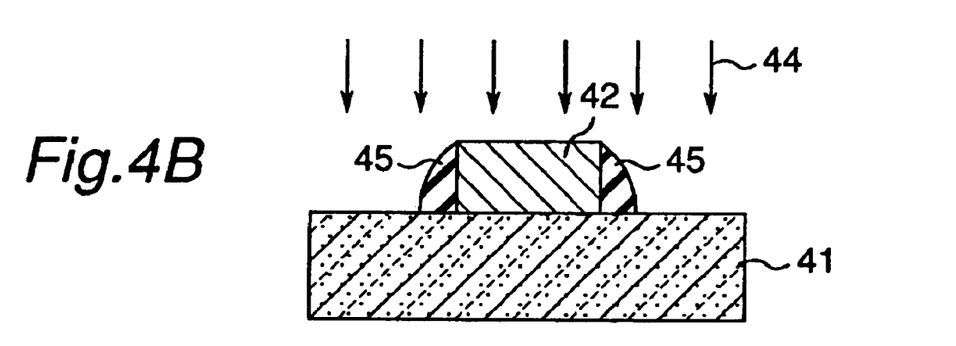

FIG. 4B is a cross sectional view of the semiconductor substrate 41 as it is at the etch back step. In FIG. 4B, the etch back is realized using an ion beam 44. The etch back step leaves the insulation film on the both sides of the gate electrode 42, which will become side walls 45.

Next, at a step 15, widths of the side walls 45 are measured.

Next, at a step 16, whether a result of the measurement on the widths of the side walls 45 complies with a predetermined standard is judged. When there is compliance with the standard, the manufacturing is furthered, for example, at a step 17 for the purpose of commercialization into a semiconductor device.

On the other hand, when there is incompliance with the standard, a step 18 of re-processing is executed. For instance, when the widths of the side walls 45 are smaller than the standard, the step 11 (pre-processing), the steps 12, 13 and 14 (post-processing) are executed, whereby the side walls 45 are further formed.

Meanwhile, when the widths of the side walls 45 are larger than the standard, the step 14 (post-processing) is carried out, whereby the side walls 45 are etched.

The measurement result at the step 15 as well is used to determine processing conditions for the steps 11 and 14 during the re-processing.

After the re-processing at the step 18, the steps 15 and 16 are executed to thereby judge once again whether the widths of the side walls 45 comply with the standard or not. When there is compliance with the standard, further manufacturing is performed at the step 17 for the purpose of commercialization into a semiconductor device. On the other hand, when there is not compliance with the standard, the re-processing of the step 18 may be carried out once again. Alternatively, discarding may be performed without the step 18.

EXAMPLE 2

Figure 5:
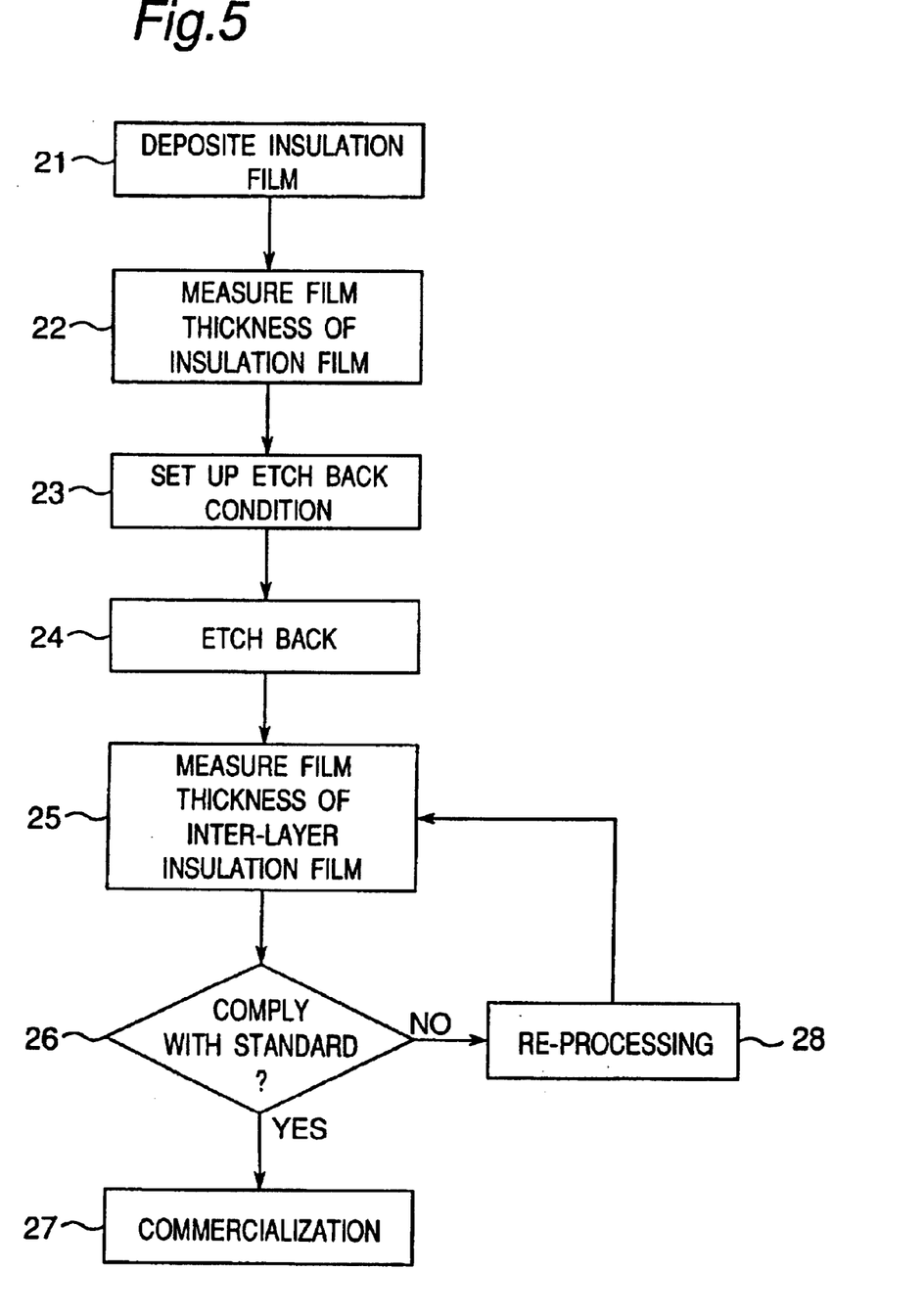
FIG. 5 is a manufacturing step diagram according to the example 2 of the present invention.
Figure 6A:
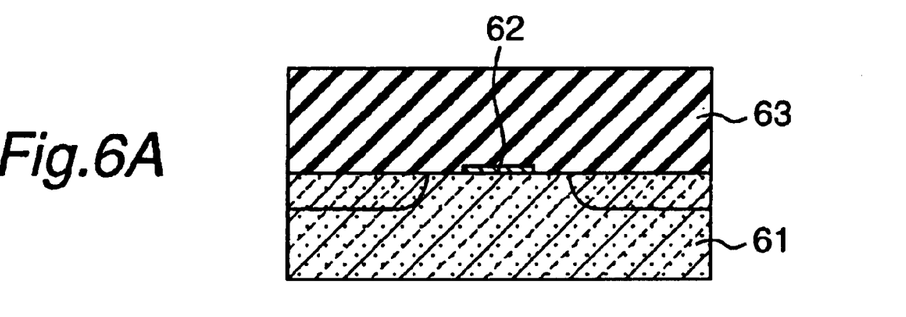
FIGS. 6A and 6B are a cross sectional view showing manufacturing steps according to the example 2 of the present invention.

FIG. 5 is a manufacturing step diagram for an inter-layer insulation film, using the present invention. Among these manufacturing steps, first, an insulation film is deposited on a semiconductor substrate, as pre-processing at a step 21. FIG. 6A is a cross sectional view of a semiconductor substrate 61 as it is after the step 21. A transistor (not shown), for instance, is formed on the semiconductor substrate 61. Denoted at 62 is a gate electrode of the transistor. An insulation film 63 is deposited so as to cover a surface of the semiconductor substrate 61 and the gate electrode 62. A silicon oxide film, for example, is used as the insulation film 63.

Next, at a step 22, a film thickness of the insulation film 63 is measured.

Next, at a step 23, using a result of the measurement at the step 22, an etching condition to etch back the insulation film 63 is set up. For setup of the etching condition, as in the example 1, an etching condition proper to the film thickness measured at the step 22 is selected from a database prepared in advance.

Figure 6B:
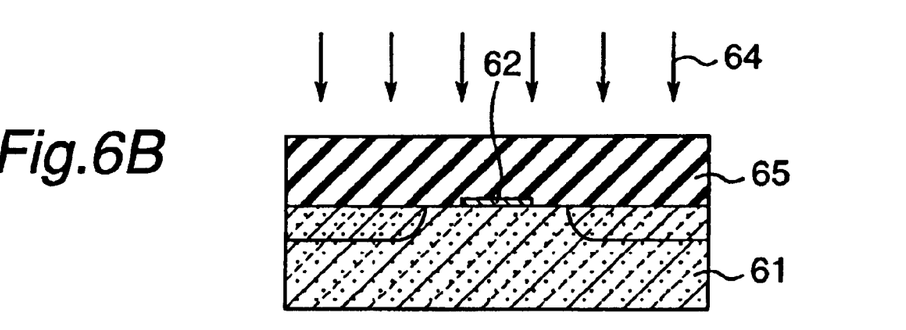

Next, at a step 24, using the etch back condition set up at the step 23, the insulation film 63 is etched back. FIG. 6B is a cross sectional view of the semiconductor substrate 61 as it is at the etch back step. In FIG. 6B, the etch back is realized using an ion beam 64. The etch back step reduces the film thickness of the insulation film 63 so that the insulation film 63 becomes an inter-layer insulation film 65 with a predetermined film thickness.

Next, at a step 25, a film thickness of the inter-layer insulation film 65 is measured.

Next, at a step 26, whether a result of the measurement on the film thickness of the inter-layer insulation film 65 complies with a predetermined standard is judged. When there is compliance with the standard, further manufacturing is performed at a step 27 for the purpose of commercialization into a semiconductor device. At the step 27, a hole, for example, is formed in the inter-layer insulation film 65 to thereby form a contact hole (not shown) connected to the transistor formed on the semiconductor substrate 61.

On the other hand, when there is not compliance with the standard, re-processing is executed at a step 28. When the film thickness of the inter-layer insulation film 65 is smaller than the standard, the step 21 (pre-processing) is carried out to further deposit the insulation film 63.

Meanwhile, when the film thickness of the inter-layer insulation film 65 is larger than the standard, the step 24 (post-processing) is carried out to etch the inter-layer insulation film 65.

After the re-processing at the step 28, the steps 25 and 26 are executed to thereby judge once again whether the film thickness of the inter-layer insulation film 65 complies with the standard or not. When there is compliance with the standard, further manufacturing is performed at the step 27 for the purpose of commercialization into a semiconductor device. On the other hand, when there is not compliance with the standard, the re-processing of the step 28 may be carried out once again. Alternatively, discarding may be performed without the step 28.

EXAMPLE 3

Figure 7A:
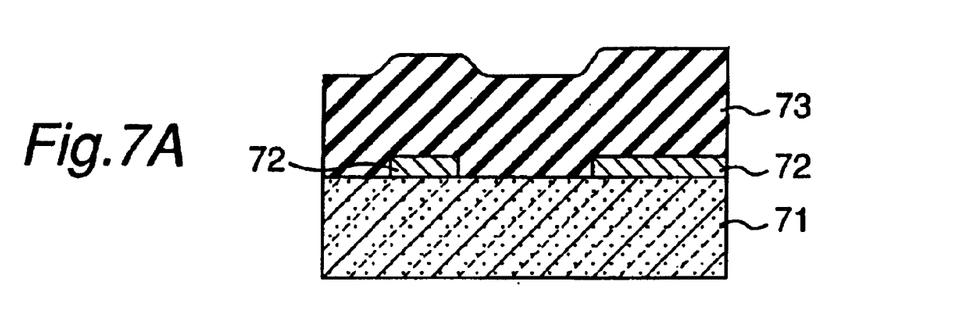
FIGS. 7A and 7B are a cross sectional view showing manufacturing steps according to the example 3 of the present invention.

The example 3 uses the manufacturing steps of the example 2 described above in order to form an inter-layer insulation film across a multilayer interconnection. Manufacturing steps of this example, as shown in FIG. 7A, are same as the manufacturing steps of the example 2, except for that a wiring layer 72 of aluminum or the like is formed on a semiconductor substrate 71.

Figure 7B:
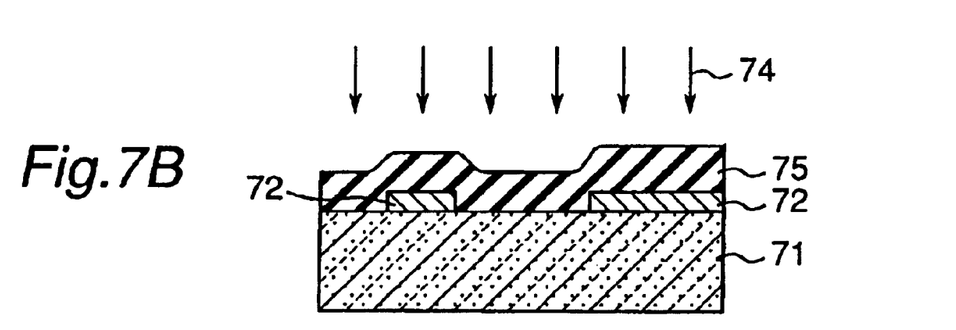

As shown in FIG. 7B, at the step 24 an insulation film 73 on the semiconductor substrate 71 is etched back using an ion beam 74 and accordingly becomes an inter-layer insulation film 75 with a predetermined film thickness.

Next, at the step 27, a hole, for example, is formed in the inter-layer insulation film 75 to thereby form a through hole (not shown). The through hole connects the wiring layer 72 with a wiring layer (not shown) formed on the inter-layer insulation film 75, whereby a multilayer interconnection is obtained.

EXAMPLE 4

Figure 8:
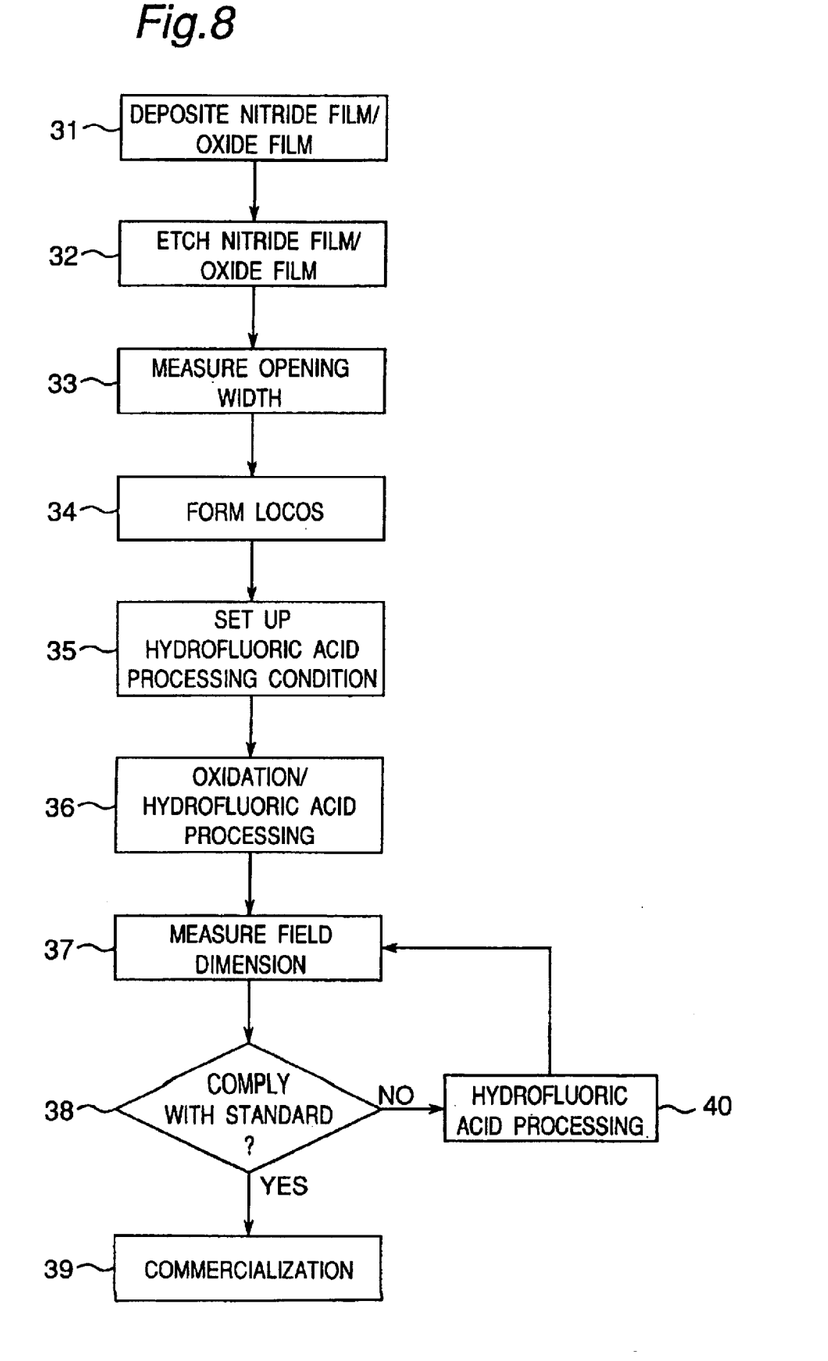
FIG. 8 is a manufacturing step diagram according to the example 4 of the present invention.
Figure 9A:
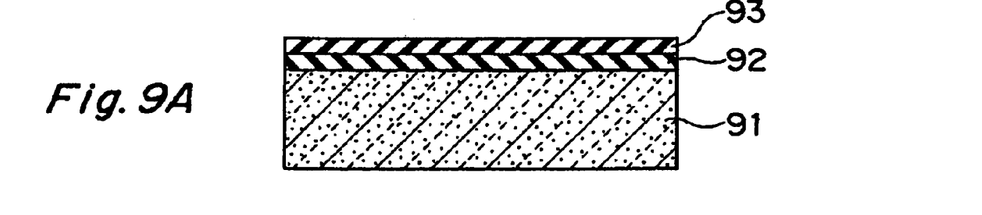
FIGS. 9A–9E are a cross sectional view showing manufacturing steps according to the example 4 of the present invention.

FIG. 8 is a manufacturing step diagram for a transistor, using the present invention. Among these manufacturing steps, first, an oxide film and a nitride film are deposited on a semiconductor substrate, as pre-processing at a step 31. FIG. 9A is a cross sectional view of a semiconductor substrate 91 of silicon or the like as it is after the step 31. An oxide film 92 of $SiO_2$ and a nitride film 93 of SiN, for instance, are deposited sequentially on the semiconductor substrate 91.

Next, at a step 32, the nitride film 93 and the oxide film 92 are etched using a resist mask (not shown) formed on the nitride film 93, thereby exposing a surface of the semiconductor substrate 91 in a LOCOS formation area.

Figure 9B:
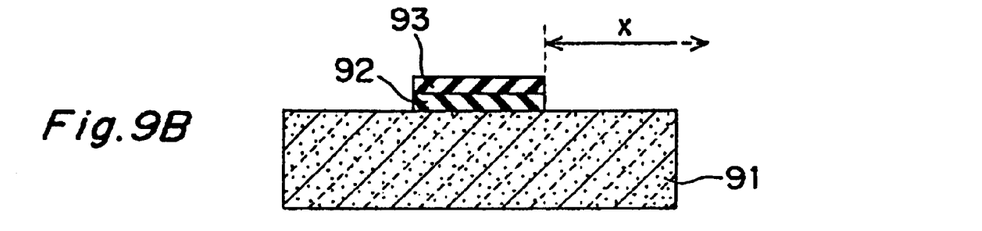

Next, at a step 33, an opening width, namely, a width of the exposed surface area of the semiconductor substrate 91 (denoted at x in FIG. 9B) is measured.

Figure 9C:
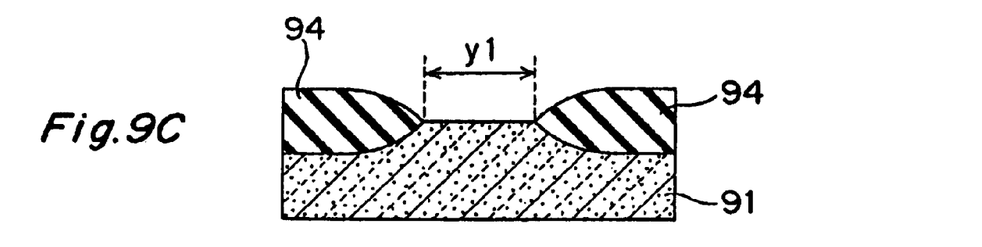

Next, at a step 34, using a thermal oxidation method, for instance, the exposed surface of the semiconductor substrate 91 is oxidized to thereby form a field oxide film. Following this, the nitride film 93 used as a mask and the oxide film 92 are removed by etching, so that LOCOS isolation areas 94 as those shown in FIG. 9C are formed.

At this stage, a surface area of the semiconductor substrate 91 sandwiched by the LOCOS isolation areas 94 becomes a transistor formation area (field region) whose width is y1.

Figure 9D:
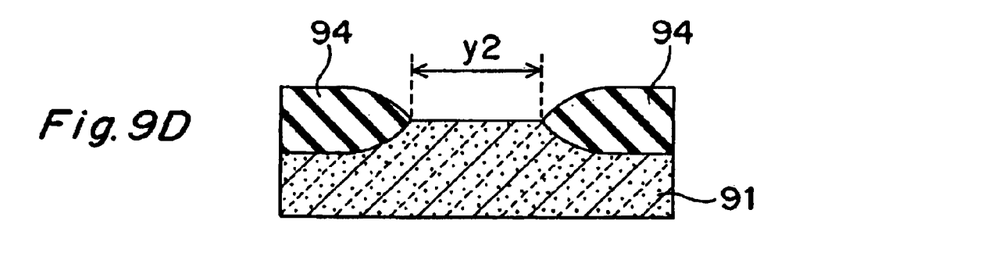

Next, at steps 35 and 36, a step is executed of forming an oxide film in a surface of the transistor formation area and removing the oxide film after through-implantation of ions via the oxide film, a step is executed of forming a gate oxide film in the transistor formation area and thereafter removing the gate oxide film in an unwanted area, etc. (not shown). At these steps, the oxide films are removed using hydracid fluoride (hydrofluoric acid), and therefore, the field oxide film in the LOCOS isolation areas 94, too, is etched. In consequence, the width of the transistor formation area expands from y1 (FIG. 9C) to y2 (FIG. 9D).

Particularly, at a step 35, a condition for hydrofluoric acid processing (post-processing), such as a concentration of hydrofluoric acid and a processing time, is determined based on a value x calculated at a step 32, using a database which stores in advance a relationship between processing conditions and a quantity of increase in the width y1 of the surface area of the semiconductor substrate 1 sandwiched by the LOCOS isolation areas 94.

Next, at a step 37, the width (field dimension) y2 of the transistor formation area (FIG. 9D) is measured.

Next, at a step 38, whether a result of the measurement on y2 complies with a predetermined standard is judged. When there is compliance with the standard, further manufacturing, for instance, is performed at a step 39 for the purpose of commercialization into a semiconductor device.

Figure 9E:
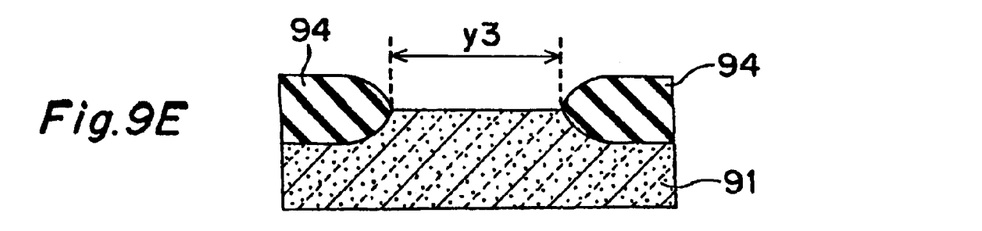

On the other hand, when there is not compliance with the standard, hydrofluoric acid processing (post-processing) is executed at a step 40. More precisely, when the measured width y2 is narrower than a predetermined width, the field oxide film of the LOCOS isolation areas 94 is etched through further hydrofluoric acid processing, whereby the width of the transistor formation area increases from y2 to y3 (FIG. 9E).

A condition for the hydrofluoric acid processing at the step 40 is determined from a database which stores in advance a relationship between processing conditions, such as a concentration of hydrofluoric acid, and a quantity of increase in the width y2 of the surface area of the semiconductor substrate 1 sandwiched by the LOCOS isolation areas 94. The database used at the step 35 may be used as this database.

After the hydrofluoric acid processing at the step 40, the width y3 of the transistor formation area (FIG. 9E) is measured once again at the step 37, in order to judge whether the width y3 complies with the standard or not. When there is compliance with the standard, further manufacturing is performed at the step 39 for the purpose of commercialization into a semiconductor device. On the other hand, when there is not compliance with the standard, the hydrofluoric acid processing of the step 40 may be executed once again. Alternatively, discarding may be performed without the step 40.

What is claimed is:

1. A manufacturing method of a semiconductor device in which a semiconductor substrate is subjected to processing includes pre-processing and post-processing, comprising;

a pre-processing step to process a semiconductor substrate;

a measurement step to measure a characteristic of said semiconductor substrate processed at said pre-processing step;

a setup step to set a processing condition for post-processing based on a result of the measurement at said measurement step;

a post-processing step to process said semiconductor substrate using said processing condition; and an inspection step to inspect a characteristic of said semiconductor substrate processed at said post-processing step and to judge whether compliance with a predetermined standard is found or not, and further comprising re-processing said semiconductor substrate judged not complying with said standard at said inspection step such that said semiconductor substrate complies with said standard.

2. The manufacturing method according to claim 1, characterized in that a processing condition for said reprocessing step is determined based on a result of the inspection at said inspection step.

3. The manufacturing method according to claim 1, characterized in that said re-processing step is one step selected from a group including said pre-processing step and said post-processing step.

4. The manufacturing method according to claim 1, characterized in that said re-processing step includes said pre-processing step, said measurement step, said setup step and said post-processing step.

5. A manufacturing method of a semiconductor device in which a semiconductor substrate is subjected to processing includes pre-processing and post-processing, comprising;

a pre-processing step to Process a semiconductor substrate;

a measurement step to measure a characteristic of said semiconductor substrate processed at said pre-processing step;

a setup step to set a processing condition for post-processing based on a result of the measurement at said measurement step;

a post-processing step to process said semiconductor substrate using said processing condition; and an inspection step to inspect a characteristic of said semiconductor substrate processed at said post-processing step and to judge whether compliance with a predetermined standard is found or not, and further comprising re-processing said semiconductor substrate judged not complying with said standard at said inspection step such that said semiconductor substrate complies with said standard, wherein said pre-processing step is a step at which an insulation film is deposited on said semiconductor substrate, and said post-processing step is a step at which said insulation film is etched using an etching condition determined from a measurement result regarding a film thickness of said insulation film.

6. A manufacturing method of a semiconductor device in which a semiconductor substrate is subjected to processing includes pre-processing and post-processing, comprising;

a pre-processing step to Process a semiconductor substrate;

a measurement step to measure a characteristic of said semiconductor substrate processed at said pre-processing step;

a setup step to set a processing condition for post-processing based on a result of the measurement at said measurement step;

a post-processing step to process said semiconductor substrate using said processing condition; and an inspection step to inspect a characteristic of said semiconductor substrate processed at said post-processing step and to judge whether compliance with a predetermined standard is found or not, and further comprising re-processing said semiconductor substrate judged not complying with said standard at said inspection step such that said semiconductor substrate complies with said standard, wherein said pre-processing step is a step at which a field oxide film is formed on said semiconductor substrate, and said post-processing step is a step at which said field oxide film is etched using an etching condition determined based on a measurement result regarding at least one dimension selected between a film thickness of said field oxide film and a width of an active layer region sandwiched by said field oxide film, from a table showing a relationship between the width of said active layer region and an etching quantity of said field oxide film, such that the width of said active layer region has a predetermined dimension.

7. A manufacturing method of a semiconductor device in which a semiconductor substrate is subjected to processing includes pre-processing and post-processing, comprising;

a pre-processing step to process a semiconductor substrate;

a measurement step to measure a characteristic of said semiconductor substrate processed at said pre-processing step;

a setup step to set a processing condition for post-processing based on a result of the measurement at said measurement step;

a post-processing step to process said semiconductor substrate using said processing condition; and an inspection step to inspect a characteristic of said semiconductor substrate processed at said post-processing step and to judge whether compliance with a predetermined standard is found or not, and further comprising re-processing said semiconductor substrate judged not complying with said standard at said inspection step, such that said semiconductor substrate complies with said standard, wherein said measurement step is a step to measure at least one dimension selected between a film thickness and a width of a predetermined portion of said semiconductor substrate.

* * * * *